United States Patent
Qin et al.

(10) Patent No.: US 11,923,875 B2
(45) Date of Patent: Mar. 5, 2024

(54) SORTING NETWORK-BASED DYNAMIC HUFFMAN ENCODING METHOD, APPARATUS AND DEVICE

(71) Applicant: INSPUR SUZHOU INTELLIGENT TECHNOLOGY CO., LTD., Jiangsu (CN)

(72) Inventors: Zhen Qin, Jiangsu (CN); Tao Yuan, Jiangsu (CN); Zhen Wang, Jiangsu (CN); Jinfu Wang, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/260,630

(22) PCT Filed: Dec. 30, 2021

(86) PCT No.: PCT/CN2021/143288
§ 371 (c)(1),
(2) Date: Jul. 7, 2023

(87) PCT Pub. No.: WO2022/148304
PCT Pub. Date: Jul. 14, 2022

(65) Prior Publication Data
US 2023/0403026 A1 Dec. 14, 2023

(30) Foreign Application Priority Data
Jan. 7, 2021 (CN) .......................... 202110019434.6

(51) Int. Cl.
*H03M 7/40* (2006.01)
*H03M 7/30* (2006.01)

(52) U.S. Cl.
CPC ........... *H03M 7/3077* (2013.01); *H03M 7/40* (2013.01)

(58) Field of Classification Search
CPC ........ H03M 7/40; H03M 7/3086; H03M 7/42; H03M 7/4037; H03M 7/6017;
(Continued)

(56) References Cited

U.S. PATENT DOCUMENTS 6,636,167 B1 * 10/2003 Acharya .................. H03M 7/40
341/65
9,509,337 B1 * 11/2016 Henry .................. H03M 7/3086
(Continued)

FOREIGN PATENT DOCUMENTS

| CN | 102244518 A | 11/2011 |
|---|---|---|
| CN | 107294539 A | 10/2017 |

(Continued)

OTHER PUBLICATIONS

International Search Report and Written Opinion received for PCT Serial No. PCT/CN2021/143288 dated Mar. 23, 2022, 10 pgs.
(Continued)

*Primary Examiner* — Linh V Nguyen
(74) *Attorney, Agent, or Firm* — Merchant & Gould P.C.

(57) ABSTRACT

Provided is a dynamic Huffman encoding method based on a sorting network. Compared with traditional dynamic Huffman coding solutions, the method implements sorting on the basis of the sorting network, therefore the sorting process is not only stable, but also may ensure a stable sorting result; and moreover, sorting steps and related operations are simpler, thereby greatly simplifying the sorting and iteration processes, and thus the sorting efficiency is higher. In addition, the sorting process better facilitates program implementation and transplantation, and implementation of hardware and software may achieve good effects. In addition, the present disclosure further provides a dynamic Huffman coding apparatus and device based on a sorting network, and a readable storage medium, and the technical effects thereof correspond to the technical effects of the above method.

20 Claims, 4 Drawing Sheets

(58) Field of Classification Search
CPC .... H03M 7/405; H03M 7/6011; H03M 7/607;
H03M 13/015; H03M 13/6569; H03M
7/30; H03M 7/3059; H03M 7/3084;
H03M 7/4043; H03M 7/4062; H03M
7/6023; H03M 7/6058; H03M 7/6088
USPC .......................................... 341/65, 106, 107
See application file for complete search history.

(56) References Cited

U.S. PATENT DOCUMENTS

| | | | | |
|---|---|---|---|---|
| 10,135,463 | B1* | 11/2018 | Satpathy | H03M 7/6023 |
| 10,693,493 | B1* | 6/2020 | Abali | H03M 7/405 |
| 10,862,509 | B1* | 12/2020 | Heil | H03M 7/405 |
| 10,944,423 | B2* | 3/2021 | Siegel | H03M 13/015 |
| 11,782,879 | B2* | 10/2023 | Cooper | G06F 21/606 |
| | | | | 711/114 |
| 11,791,838 | B2* | 10/2023 | Salamat | G06F 3/0673 |
| | | | | 711/154 |

FOREIGN PATENT DOCUMENTS

| | | |
|---|---|---|
| CN | 108897908 A | 11/2018 |
| CN | 108958702 A | 12/2018 |
| CN | 112003625 A | 11/2020 |
| CN | 112737596 A | 4/2021 |

OTHER PUBLICATIONS

Chinese Search Report received for Chinese Serial No. 2021100194346 dated Sep. 7, 2022, 2 pgs.

* cited by examiner

SORTING NETWORK-BASED DYNAMIC HUFFMAN ENCODING METHOD, APPARATUS AND DEVICE

CROSS-REFERENCE TO RELATED APPLICATION

The present application is a National Stage Filing of PCT International Application No. PCT/CN2021/143288 filed on Dec. 30, 2021, which claims priority to the Chinese patent application No. 202110019434.6, filed before the China National Intellectual Property Administration (CNIPA) on Jan. 7, 2021, which is incorporated herein by reference in its entirety.

TECHNICAL FIELD

The present disclosure relates to the technical field of computers, and in particular, to a dynamic Huffman encoding method, apparatus and device based on a sorting network, and a readable storage medium.

BACKGROUND

In recent years, with the continuous development of science and technology, data information presents an explosive increase. With the rise of cloud computing, the propulsion of artificial intelligence and the arrival of big data era, new workloads continuously increase, and the problems of massive data transmission and storage have continuously attracted attention. How to efficiently transmit massive data without causing a too heavy load to a processor needs to be solved urgently.

If pre-compression may be performed during file transmission, not only can the data traffic be saved, but the transmission time can also be shortened; and if a file is compressed before the disk file is read, the file reading rate may be increased. In summary, data compression provides a method for improving computer performance from a new perspective, and thus the research thereon has important practical significance.

Widely applied effective compression algorithms should have three important characteristics: universality, non-loss and high compression ratios. The universality refers to the generality of source data, the particularity of many data is determined by their own coding modes, and the compression effect may be greatly improved by performing targeted research according to these particularities, and a universal compression algorithm suitable for non-particular data is focused on herein. Non-loss refers to that a code after data compression has the same amount of information as a source code. The high compression ratio refers to that the result of reducing a storage space than an original storage space after compression is as large as possible. In the current situation, lossless compression with universality is slow in development because data features are unknown and information is not allowed to be lost, such that the compression rate cannot be greatly improved, and thus lossless compression becomes a necessary research subject.

DEFLATE is a classical lossless data compression standard, which utilizes LZ77 and Huffman coding at the same time, wherein LZ77 is a dictionary-based lossless compression algorithm of a sliding window, and Huffman coding is used for performing secondary compression on data compressed by LZ77. However, bubbling sorting, insertion sorting, quick sorting or heap sorting are often utilized during an existing Huffman coding process, these sorting solutions are either low in efficiency or unstable.

SUMMARY

The objective of the present disclosure is to provide a dynamic Huffman encoding method, apparatus and device based on a sorting network, and a readable storage medium, so as to solve the problem of low efficiency or instability of a sorting process in the existing Huffman coding algorithm. The specific solution is as follows:

In a first aspect, the present disclosure provides a dynamic Huffman encoding method based on a sorting network, wherein the sorting network includes n stages of sorting modules, n is a positive integer, and the method includes:

S1, acquiring elements to be sorted, and initializing i=1, wherein the elements to be sorted include Literal elements (character elements) and Length elements (length elements), the Literal elements are used for describing the number of occurrences of each character in a target text, and the Length elements are used for describing the numbers of occurrences of character strings of different length intervals in the target text;

S2, in an ith-stage sorting module, generating, by using each of ith-stage sorting units and by means of i times of parallel comparison, a sorting result of $2^i$ elements to be sorted according to the sorting result of a previous-stage sorting module, so as to obtain the sorting result of the ith-stage sorting module, wherein the ith-stage sorting module includes $n/2^i$ parallel ith-stage sorting units;

S3, judging whether i is less than n, when i is less than n, increasing i by 1 and entering S2; when i is equal to n, determining that the sorting result of the ith-stage sorting module is the sorting result of the elements to be sorted; and S4, constructing a Huffman tree according to the sorting result of the elements to be sorted, and encoding the target text according to the Huffman tree.

In an embodiment, before acquiring the elements to be sorted, the method further includes:

determining the Literal elements and the Length elements according to the target text;

generating padding elements when the number of the Literal elements and the number of the Length elements fall between $2^{n-1}$ and $2^n$, so that the total sum of the number of the Literal elements, the number of the Length elements and the number of the padding elements is $2^n$; and using the Literal elements, the Length elements and the padding elements as the elements to be sorted.

In an embodiment, the Literal element and the Length element each includes m bits, wherein m1 bits represent the number of occurrences of a character or a character string, m2 bits represent that the current element is the Literal element or the Length element, m is a positive integer greater than 2, and m=m1+m2.

In an embodiment, the padding element includes m bits, and each bit is 1.

In an embodiment, the value of m is 16.

In an embodiment, the step: in the ith-stage sorting module, generating, by using each of ith-stage sorting units and by means of i times of parallel comparison, the sorting result of $2^i$ elements to be sorted according to the sorting result of the previous-stage sorting module, includes:

when i is 1, in a first-stage sorting module, the first first-stage sorting unit is used for sorting the first two elements to be sorted, wherein the sorting process includes: comparing the first element to be sorted with the second element to be sorted, so as to obtain the sorting result of the two elements to be sorted.

In an embodiment, the step: in the ith-stage sorting module, generating, by using each of ith-stage sorting units and by means of i times of parallel comparison, the sorting result of $2^i$ elements to be sorted according to the sorting result of the previous-stage sorting module, includes:

when i is 2, in a second-stage sorting module, the first second-stage sorting unit is used for sorting the sorting results of the first two first-stage sorting units in the first-stage sorting module, wherein the sorting process includes: comparing the first element to be sorted with the fourth element to be sorted according to the current sorting result, and meanwhile, comparing the second element to be sorted with the third element to be sorted; adjusting the arrangement sequence of the elements to be sorted according to a comparison result; and comparing the first element to be sorted with the second element to be sorted, and meanwhile, comparing the third element to be sorted with the fourth element to be sorted, so as to obtain the sorting result of the four elements to be sorted.

In a second aspect, the present disclosure provides a dynamic Huffman coding apparatus based on a sorting network, wherein the sorting network includes n stages of sorting modules, n is a positive integer, and the apparatus includes:

an element acquisition module, configured to acquire elements to be sorted, and initialize i=1, wherein the elements to be sorted include Literal elements and Length elements, the Literal elements are used for describing the number of occurrences of each character in a target text, and the Length elements are used for describing the numbers of occurrences of character strings of different length intervals in the target text;

a parallel comparison module configured to: in an ith-stage sorting module, generate, by using each of ith-stage sorting units and by means of i times of parallel comparison, a sorting result of $2^i$ elements to be sorted according to the sorting result of a previous-stage sorting module, so as to obtain the sorting result of the ith-stage sorting module, wherein the ith-stage sorting module includes $n/2^i$ parallel ith-stage sorting units;

a cyclic calling module configured to: when i is less than n, increase i by 1 and enter the parallel comparison module;

a sorting result module configured to: when i is equal to n, determine that the sorting result of the ith-stage sorting module is the sorting result of the elements to be sorted; and a encoding module, configured to construct a Huffman tree according to the sorting result of the elements to be sorted, and code the target text according to the Huffman tree.

In a third aspect, the present disclosure provides a dynamic Huffman coding device based on a sorting network, including:

a memory, configured to store a computer program; and a processor, configured to execute the computer program, so as to implement the dynamic Huffman encoding method based on the sorting network as described above.

In a fourth aspect, the present disclosure provides a readable storage medium, wherein a computer program is stored on the readable storage medium, and the computer program is used for, when executed by a processor, implementing the dynamic Huffman encoding method based on the sorting network as described above.

Compared with the traditional dynamic Huffman coding solutions, the dynamic Huffman encoding method based on the sorting network provided in the present disclosure has the advantages that sorting is implemented on the basis of the sorting network in the method, the sorting process is not only stable, but also may ensure a stable sorting result; and moreover, sorting steps and related operations are simpler, thereby greatly simplifying the sorting and iteration processes, and thus the sorting efficiency is higher. In addition, the sorting process better facilitates program implementation and transplantation, and implementation of hardware and software may achieve good effects.

In addition, the present disclosure further provides a dynamic Huffman coding apparatus and device based on a sorting network, and a readable storage medium, wherein the technical effects thereof correspond to the technical effects of the above method, and thus are not repeatedly described herein.

BRIEF DESCRIPTION OF THE DRAWINGS

To illustrate technical solutions in the embodiments of the present disclosure or in the prior art more clearly, a brief introduction on the drawings which are needed in the description of the embodiments or the prior art is given below. Apparently, the drawings in the description below are merely some of the embodiments of the present disclosure, based on which other drawings may be obtained by those ordinary skilled in the art without any creative effort.

DETAILED DESCRIPTION OF THE EMBODIMENTS

In order to enable those skilled in the art to better understand the solutions of the present disclosure, the present disclosure is further described in detail below in combination with drawings and specific embodiments. Apparently, the embodiments described below are merely a part, but not all, of the embodiments of the present disclosure. All of other embodiments, obtained by those ordinary skilled in the art based on the embodiments in the present disclosure without any creative effort, fall into the protection scope of the present disclosure.

Huffman coding (Huffman Coding) is lossless data compression coding invented by in David A Huffman 1952. Due to its high efficiency, Huffman coding has been widely used in the fields of computers, data encryption, communications, and the like. Huffman coding is an important step in a classical lossless compression standard DEFLATE, and along with the wide use of the DEFLATE compression format, and the requirements of low CPU occupancy rate and high throughput rate in each scenario, an economic and efficient hardware implementation of Huffman coding is a popular topic at present.

Huffman coding is divided into static Huffman coding and dynamic Huffman coding, wherein a static Huffman coding process mainly focuses on table lookup, so that the algorithm is relatively simple, but the flexibility is worse; and the dynamic Huffman coding is not beneficial for hardware implementation due to the tedious calculation and generation process of a Huffman tree and the data storage form of a binary tree, and has the difficulty of large calculation amount and storage waste for software implementation. The present disclosure only discusses the dynamic Huffman coding with a relatively complex algorithm.

In the classical lossless compression standard DEFLATE, Huffman coding is used for performing secondary compression on data compressed by LZ77, so as to further improve the compression rate. The compression principle of Huffman coding is: counting the number of occurrences of a character, performing variable-length coding on data processing, constructing a Huffman tree according to the number of occurrences of the character, and then performing coding according to the Huffman tree, so that the overall size of data can be reduced, and the purpose of data compression is thus achieved.

The construction of a dynamic Huffman tree is the core of the DEFLATE algorithm, and a successful and efficient sorting work is a prerequisite for ensuring the successful construction of the Huffman tree. Here, the entire process of sorting is illustrated by one example, and a target text is first read before the Huffman tree is established:

They had hardly begun to do so, and the trembling people who had hidden themselves were scarcely at home again, when Edward, the elder of the two exiled Princes, came over from Normandy with a few followers, to claim the English Crown. His mother Emma, however, who only cared for her last son Hardicanute, instead of assisting him, as he expected, opposed him so strongly with all her influence that he was very soon glad to get safely back. His brother Alfred was not so fortunate. Believing in an affectionate letter, written some time afterwards to him and his brother, in his mother's name (but whether really with or without his mother's knowledge is now uncertain), he allowed himself to be tempted over to England, with a good force of soldiers, and landing on the Kentish coast, and being met and welcomed by Earl Godwin, proceeded into Surrey, as far as the town of Guildford. Here, he and his men halted in the evening to rest, having still the Earl in their company; who had ordered lodgings and good cheer for them. But, in the dead of the night, when they were off their guard, being divided into small parties sleeping soundly after a long march and a plentiful supper in different houses, they were set upon by the King's troops, and taken prisoners. Next morning they were drawn out in a line, to the number of six hundred men, and were barbarously tortured and killed; with the exception of every tenth man, who was sold into slavery. As to the wretched Prince Alfred, he was stripped naked, tied to a horse and sent away into the Isle of Ely, where his eyes were torn out of his head, and where in a few days he miserably died. I am not sure that the Earl had willfully entrapped him, but I suspect it strongly.

If the dynamic Huffman compression coding needs to be performed on the target text, the number of occurrences of each character in the target text is counted at first. According to a statistical result, the occurrence frequency of each character may be as shown in Table 1:

TABLE 1

| Character | ASCII code | The number of occurrences |
|---|---|---|
| (line feed) | 10 | 26 |
| (carriage return) | 13 | 26 |
| (blank) | 32 | 321 |
| ' | 39 | 3 |
| ( | 40 | 1 |
| ) | 41 | 1 |
| , | 44 | 33 |
| . | 46 | 9 |
| ; | 59 | 2 |
| A | 65 | 3 |
| B | 66 | 2 |
| C | 67 | 1 |
| E | 69 | 8 |
| G | 71 | 2 |
| H | 72 | 4 |
| I | 73 | 3 |
| K | 75 | 2 |
| N | 78 | 2 |
| P | 80 | 2 |
| S | 83 | 1 |
| T | 84 | 1 |
| a | 97 | 93 |
| b | 98 | 16 |
| c | 99 | 23 |
| d | 100 | 76 |
| e | 101 | 182 |
| f | 102 | 34 |
| g | 103 | 27 |
| h | 104 | 87 |
| i | 105 | 84 |
| k | 107 | 5 |
| l | 108 | 61 |
| m | 109 | 34 |
| n | 110 | 98 |
| o | 111 | 100 |
| p | 112 | 22 |
| r | 114 | 92 |
| s | 115 | 75 |
| t | 116 | 114 |
| u | 117 | 26 |
| v | 118 | 11 |
| w | 119 | 44 |
| x | 120 | 5 |
| y | 121 | 27 |

In order to smoothly perform subsequent dynamic Huffman coding, the characters in Table 1 need to be sorted according to the number of occurrences. The selection of the sorting solution will affect the sorting efficiency, and the sorting solution used by the classical dynamic Huffman coding is bubbling sorting or insertion sorting at present.

The bubbling sorting is to adjust small elements forward or adjust large elements backward. It should be noted that two adjacent elements are compared, and exchange also occurs between the two elements. Therefore, if the two elements are equal, they do not need to be exchanged. If two equal elements are not adjacent to each other, even if the two elements are adjacent to each other by means of the previous exchange operation, the positions of the two elements are not exchanged finally, so that the sequence of the same elements is not changed after being sorted. Therefore, the bubbling sorting is a stable sorting algorithm.

The insertion sorting is to insert an element at a time on the basis of an ordered small sequence. Of course, this ordered small sequence only has one element at the beginning, that is, the first element. Comparison is performed starting from the end of the ordered sequence, that is, an element to be inserted is compared with an already ordered maximum element, if the element to be inserted is greater than the already ordered maximum element, the element to be inserted is directly inserted behind the already ordered maximum element, otherwise forward search is performed until the insertion position of the element to be inserted is found. If encountering an element equal to the element to be inserted, the element to be inserted is placed behind the equal element. Therefore, the sequence of the equal elements is not changed, and the sequence out of the original disordered sequence is still an ordered sequence, so that the insertion sorting is stable.

As can be seen from the above analysis, the bubbling sorting and screening sorting have stability, however, their temporal complexity is O (n^2). Such sorting efficiency is not ideal, the time complexity of the sorting algorithm directly affects the efficiency of the compression process, especially for hardware implementation of a compression function, the lengthy sorting process greatly affects the processing process of a data stream, and occupies a large amount of storage space. Therefore, it is later proposed by someone that quick sorting or heap sorting is applied to the dynamic Huffman coding, and the quick sorting and the heap sorting are respectively introduced below.

The quick sorting has two directions, a left subscript i keeps moving rightward (when a[i]<=a[center_index]), and a right subscript j keeps moving leftward (when a[j]>a[center_index]), wherein center_index is an array index of a central element, and is usually an 0th element of an array. If both i and j cannot move, i<=j, a[i] and a[j] are exchanged, and the above process is repeated until i>j. a [j] and a[center_index] are exchanged to complete a quick sorting operation. However, when the central element and a [j] are exchanged, it is very likely to disrupt the stability of the previous elements, for example, in a sequence 5, 3, 3, 4, 3, 8, 9, 10, 11, the stability of the element 3 is disrupted if the central elements 5 and 3 (the fifth element, the subscript is counted starting from 1) are exchanged. Therefore, the quick sorting is an unstable sorting algorithm, and instability occurs at the moment when the central element is exchanged with a[j].

The structure of the heap sorting is that child nodes of a node i are nodes 2*i and 2*i+1, a big top heap requires a father node to be greater than or equal to the two child nodes thereof, and a small top heap requires the father node to be less than or equal to the two child nodes thereof. In a sequence with a length of n, the process of heap sorting is to select the maximum (the big top heap) value or the minimum (the small top heap) value of three values from a father node n/2 and the child nodes thereof, and the selection among the three elements does not disrupt the stability. But when elements are selected for father nodes n/2−1, n/2−2, ..., 1, the stability is disrupted. It is possible that the father node n/2 exchanges a subsequent element, but the father node n/2−1 does not exchange the next identical element, then the stability between the two identical elements is disrupted. Therefore, the heap sorting is not a stable sorting algorithm.

The time complexity of the best case of the heap sorting and the quick sorting is O(n lg n), and the sorting efficiency is improved. However, as can be seen from the above analysis, the quick sorting and the heap sorting do not have stability. For unknown and diverse compression data, various possibilities may occur during the process of sorting, and the properties of the unstable sorting algorithm directly affects the sorting result.

In summary, in view of the defects in the dynamic Huffman coding solution that the sorting process is complex and there is a risk of instability when the Huffman tree is generated, the present disclosure provides a dynamic Huffman encoding method, apparatus and device based on a sorting network, and a readable storage medium from the perspective of how to reduce the calculation time and implement hardware. In the present disclosure, the numbers of occurrences of characters based on statistics are sorted by using the sorting network, thereby simplifying the calculation steps in the sorting process, saving the sorting time, and also ensuring the stability of the sorting result at the same time. The present disclosure may focus on data compression acceleration, so as to facilitate to improve the performance of a data center.

Embodiment 1 of a dynamic Huffman encoding method based on a sorting network provided in the present disclosure is introduced below.

Figure 1:
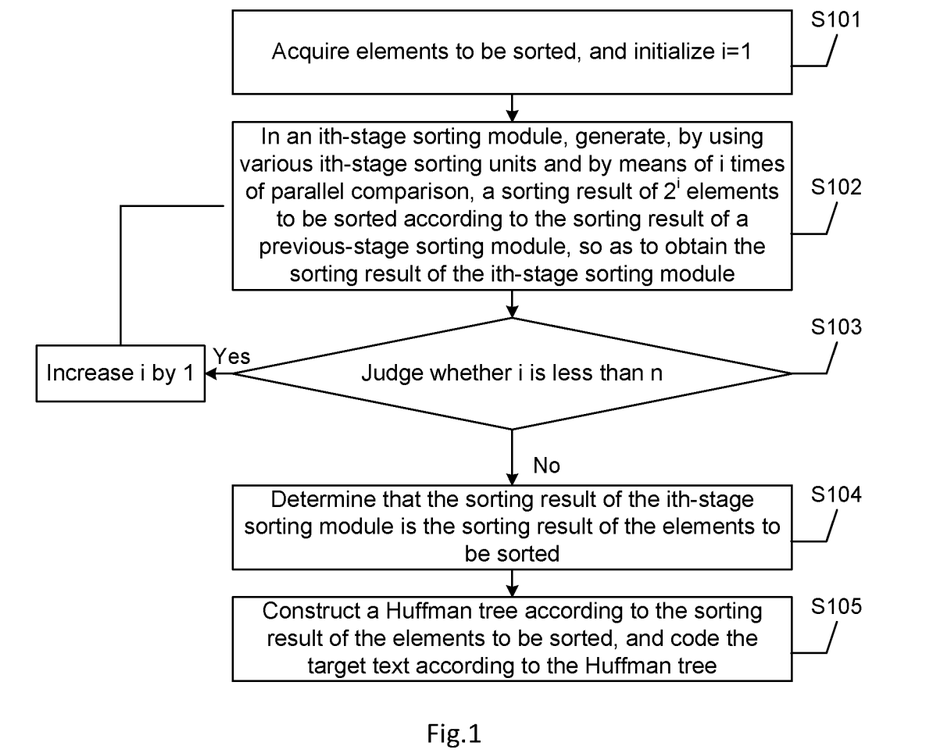
FIG. 1 is a flowchart of Embodiment 1 of a dynamic Huffman encoding method based on a sorting network provided in the present disclosure.

In the present embodiment, the sorting network includes n stages of sorting modules, n is a positive integer, and as shown in FIG. 1, the implementation process of the present embodiment may specifically include the following steps:

S101, acquiring elements to be sorted, and initializing i=1.

The elements to be sorted include Literal elements and Length elements, the Literal elements are used for describing the number of occurrences of each character in a target text, and the Length elements are used for describing the numbers of occurrences of character strings of different length intervals in the target text. The value range of i is from 1 to n.

S102, in an ith-stage sorting module, generating, by using each of ith-stage sorting units and by means of i times of parallel comparison, a sorting result of $2^i$ elements to be sorted according to the sorting result of a previous-stage sorting module, so as to obtain the sorting result of the ith-stage sorting module.

The ith-stage sorting module includes $n/2^i$ parallel ith-stage sorting units.

S103, judging whether i is less than n, if so, increasing i by 1 and entering S2; and otherwise, that is, when i is equal to n, entering S104.

S104, determining that the sorting result of the ith-stage sorting module is the sorting result of the elements to be sorted.

S105, constructing a Huffman tree according to the sorting result of the elements to be sorted, and encoding the target text according to the Huffman tree.

Specifically, the Huffman tree is constructed according to the sorting result, and then coding is performed from a leaf node to a root node of the tree, characters with greater numbers of occurrences are replaced with some short codes, and characters with smaller numbers of occurrences are replaced with some long codes, so that the overall size of the data can be reduced, and the purpose of data compression is thus achieved.

Specifically, before S101, the method further includes a process of generating the elements to be sorted according to the target text. According to the foregoing description on the structure of the sorting network, it can be seen that the number of elements to be sorted allowed to be input by the sorting network is $2^n$, and it is considered that in practical applications, the number of elements to be sorted generated according to the target text may be not $2^n$, therefore in the present embodiment, when the elements to be sorted are generated, padding elements also need to be generated according to actual situations. The specific process is as follows: performing statistics on the target text to obtain the Literal elements and Length elements; generating padding elements when the number of the Literal elements and the number of the Length elements fall between $2^{n-1}$ and $2^n$, so that the total sum of the number of the Literal elements, the number of the Length elements and the number of the padding elements is $2^n$; and using the Literal elements, the Length elements and the padding elements as the elements to be sorted.

As a specific embodiment, the padding elements may be all-0 elements or all-1 elements.

It can be understood that, since the elements to be sorted in the present embodiment at least include two elements, that is, the Literal elements and the Length elements, it is necessary to set a flag bit in the elements to indicate whether the current element is the Literal element or the Length element. Specifically, in the present embodiment, the Literal element and the Length element each includes m bits, wherein m1 bits represent the number of occurrences of a character or a character string, m2 bits represent that the current element is the Literal element or the Length element, m is a positive integer greater than 2, and m=m1+m2.

As a specific embodiment, the value of m may be 16.

In order to further illustrate the sorting process of the present embodiment, when the value of n is any positive integer greater than or equal to 2, the sorting processes of a first-stage sorting module and a second-stage sorting module are respectively described below.

When i is 1, in the first-stage sorting module, the first first-stage sorting unit is used for sorting the first two elements to be sorted, wherein the sorting process includes: comparing the first element to be sorted with the second element to be sorted, so as to obtain the sorting result of the two elements to be sorted. It can be seen that the first first-stage sorting unit may obtain the sorting result of the two elements through one-time comparison, the sorting processes of other first-stage sorting units are similar to the sorting process of the first first-stage sorting unit, and thus are not repeated herein. Finally, the sorting result of all first-stage sorting units is the sorting result of the first-stage sorting module.

When i is 2, in the second-stage sorting module, the first second-stage sorting unit is used for sorting the sorting results of the first two first-stage sorting units in the first-stage sorting module, wherein the sorting process includes: comparing the first element to be sorted with the fourth element to be sorted according to the current sorting result, and meanwhile, comparing the second element to be sorted with the third element to be sorted; adjusting the arrangement sequence of the elements to be sorted according to a comparison result; and comparing the first element to be sorted with the second element to be sorted, and meanwhile, comparing the third element to be sorted with the fourth element to be sorted, so as to obtain the sorting result of the four elements to be sorted. It can be seen that the first second-stage sorting unit may obtain the sorting result of the four elements through twice parallel comparison, the sorting processes of other second-stage sorting units are similar to the sorting process of the first second-stage sorting unit, and thus are not repeated herein. Finally, the sorting result of all second-stage sorting units is the sorting result of the second-stage sorting module.

Figure 2:
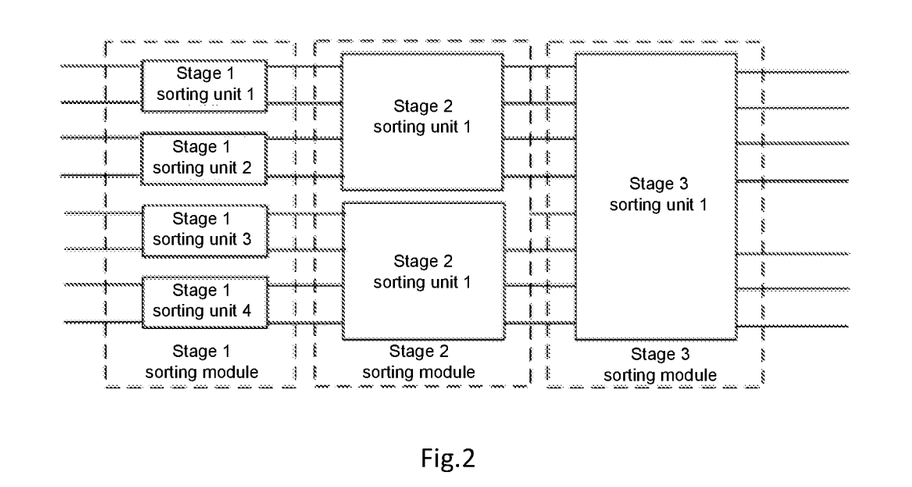
FIG. 2 is a schematic diagram of modules of a sorting network when n=3 in Embodiment 1 of the dynamic Huffman encoding method based on the sorting network provided in the present disclosure.

The sorting process described in S101 to S104 in the present embodiment is described below with a specific application as an example. When the value of n is 3, the structure of the sorting network is shown in FIG. 2. As shown in FIG. 2, when the value of n is 3, the number of the elements to be sorted is 8, and the corresponding sorting process is as follows:

the eight elements to be sorted are input into the first-stage sorting module of the sorting network, and n=1 is initialized; the first-stage sorting module includes four first-stage sorting units, each first-stage sorting unit generates the sorting result of two elements to be sorted through one-time comparison, the sorting result of the four first-stage sorting units is the sorting result of the first-stage sorting module, at this time, n=1<3, therefore n is increased by 1, and the next stage is processed; the second-stage sorting module includes two second-stage sorting units, each second-stage sorting unit generates the sorting result of the four elements to be sorted through twice parallel comparison, and the sorting result of the two second-stage sorting units is the sorting result of the second-stage sorting module, at this time, n=2<3, therefore n is increased by 1, and the next stage is processed; a third-stage sorting module includes one third-stage sorting unit, the third-stage sorting unit generates the sorting result of the eight elements to be sorted through three times of parallel comparison, that is, the sorting result of the third-stage sorting module, at this time, n=3, there is no next stage, therefore the sorting result of the third-stage sorting module is directly used as the sorting result of the entire sorting network, and the sorting result of all eight elements to be sorted is obtained so far.

The dynamic Huffman encoding method based on the sorting network provided in the present embodiment at least has the following advantages:

First, the sorting process in the dynamic Huffman coding solution has stability and has a stable and reliable effect.

Second, compared with the sorting algorithms utilized in the traditional dynamic Huffman coding solutions, the sorting process has simpler sorting steps and higher sorting efficiency, so that a basis can be provided for the efficient implementation of data compression.

Third, the sorting network involved in the solution is suitable for hardware implementation, so that hardware becomes possible. If the solution is implemented in a hardware manner, it can become a hardware acceleration technology, which is proposed for network data storage, the compression of DEFLATE data can be accelerated, and the load of a server CPU is effectively reduced.

Embodiment 2 of a dynamic Huffman encoding method based on a sorting network provided in the present disclosure is described below in detail.

In the present embodiment, dynamic Huffman coding based on the sorting network utilizes a parallel sorting algorithm, in the sorting network, each stage of sorting module includes a plurality of sorting units, during the sorting process using the sorting network, the sorting units in the same-stage sorting module are used for sorting at the same time, and each sorting unit may realize the parallel comparison of a plurality of pairs of elements to be sorted, thereby further improving the sorting speed.

Figure 3:
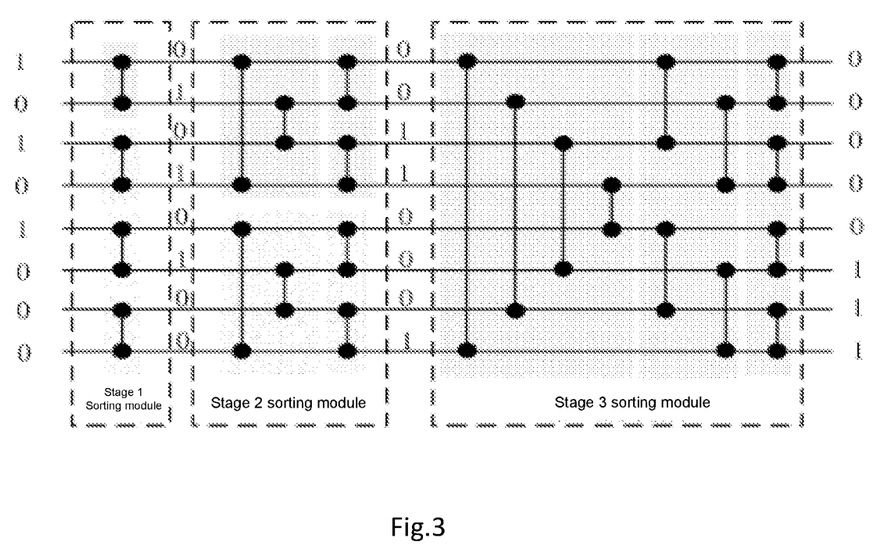
FIG. 3 is a schematic diagram of wiring of a sorting network in Embodiment 2 of the dynamic Huffman encoding method based on the sorting network provided in the present disclosure.

The sorting network is introduced at first. The sorting network is composed of lines and sorting units, and one line transmits one element from one sorting unit to another sorting unit. When the value of n is 3, the structure of the sorting network is shown in FIG. 3, in FIG. 3, different patterns in each stage of sorting module represent different sorting units, for example, the first-stage sorting module includes four sorting units. Starting from the second-stage sorting module, the same patterns, which are not connected with each other, represent different sorting processes of the same sorting unit, for example, in the second-stage sorting module shown in FIG. 3, the first second-stage sorting module includes two parallel sorting processes: in the first parallel sorting process, the first element to be sorted is compared with the fourth element to be sorted, and meanwhile, the second element to be sorted is compared with the third element to be sorted; and in the second parallel sorting process, the first element to be sorted is compared with the second element to be sorted, and meanwhile, the third element to be sorted is compared with the fourth element to be sorted.

Figure 4:
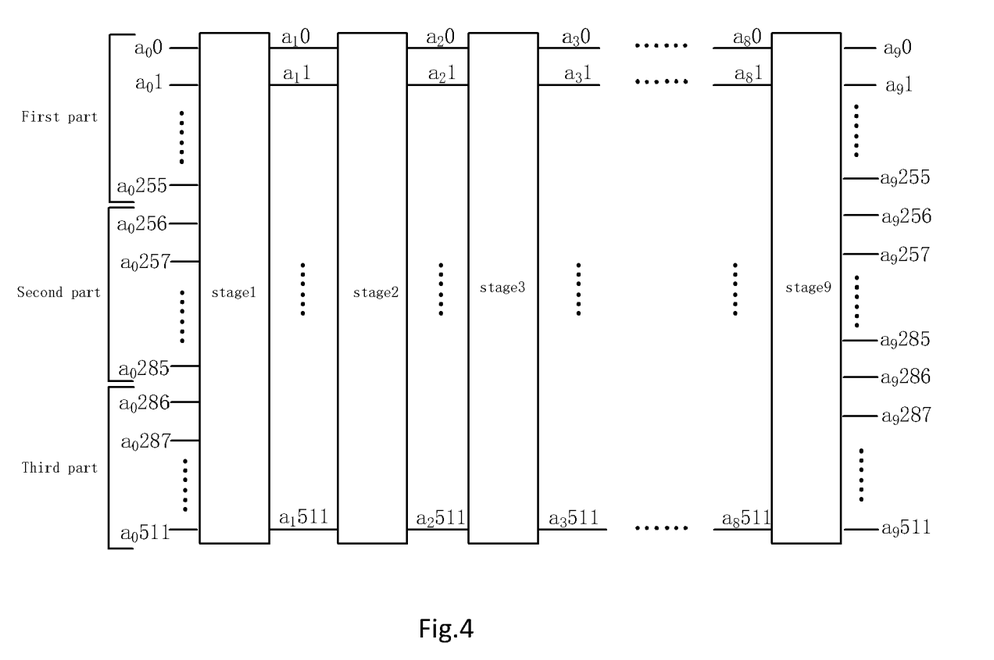
FIG. 4 is a schematic diagram of the sorting network during a practical application process in Embodiment 2 of the dynamic Huffman encoding method based on the sorting network provided in the present disclosure.

FIG. 4 shows a sorting network in practical applications, this sorting network has time complexity of O(1g/2n) and has stability. The characteristics of parallel comparison in each sorting module may make it suitable for hardware implementation.

When Huffman coding is actually used, it is assumed that the number of elements to be sorted is 286, that is, a first part and a second part of input elements in FIG. 4 ($a_0 0$, $a_0 1$, $a_0 285$), wherein the first part ($a_0 0$, $a_0 1$, $a_0 255$) is Literal elements, and the second part ($a_0 256$, $a_0 257$, . . . $a_0 285$) is Length elements. Since the sorting network has a special structure, it is necessary to ensure that the number of input elements is $2^n$, therefore padding elements, that is, a third part of the input elements ($a_0 286$, $a_0 287$, $a_0 511$), are generated in the present embodiment.

It can be seen from recursive analysis that, for the sorting network having 512 input elements, the first-stage sorting module (stage 1) requires 1 beat to complete parallel sorting, the second-stage sorting module (stage 2) requires 2 beats to complete parallel sorting, until a ninth-stage sorting module (stage 9) requires 9 beats to complete parallel sorting. Therefore, the sorting of the 512 elements only requires 45 (1+2+ . . . +9=45) beats to complete the sorting. That is, after the elements to be sorted are input, only 45 parallel sorting processes are required to obtain the sorting result.

In the present embodiment, the elements to be sorted are 16 bits, and the format is shown in Table 2. The first item is the Literal element, Bit 14-0 thereof is a counted number of occurrences, and Bit 15 is a distinguishing bit "0" of Literal and Length; the second item is the Length element, the Bit 14-0 thereof is a counted number of occurrences, and Bit 15 is a distinguishing bit "1" of Literal and Length; and the third item is the padding element, which is only used for making up the number of inputs, and the values of the padding elements are set to all "1" in the present embodiment.

TABLE 2

|  | Bit 15 | Bit 14 | Bit 13-0 |
|---|---|---|---|
| Literal | 0 | 0 | XXXX |
| Length | 1 | 0 | XXXX |
| Padding element | 1 | 1 | 111 |

The sorting result is obtained after 45 beats, as shown in FIG. 4, wherein the first part ($a_9 0$, $a_9 1$, . . . , $a_9 255$) is the sorting result of the Literal elements; the second part ($a_9 256$, $a_9 257$, . . . , $a_9 285$) is the sorting result of the Length elements; and the third part ($a_9 286$, $a_9 287$, . . . , $a_9 511$) is padding elements, which may not be considered.

Figure 5:
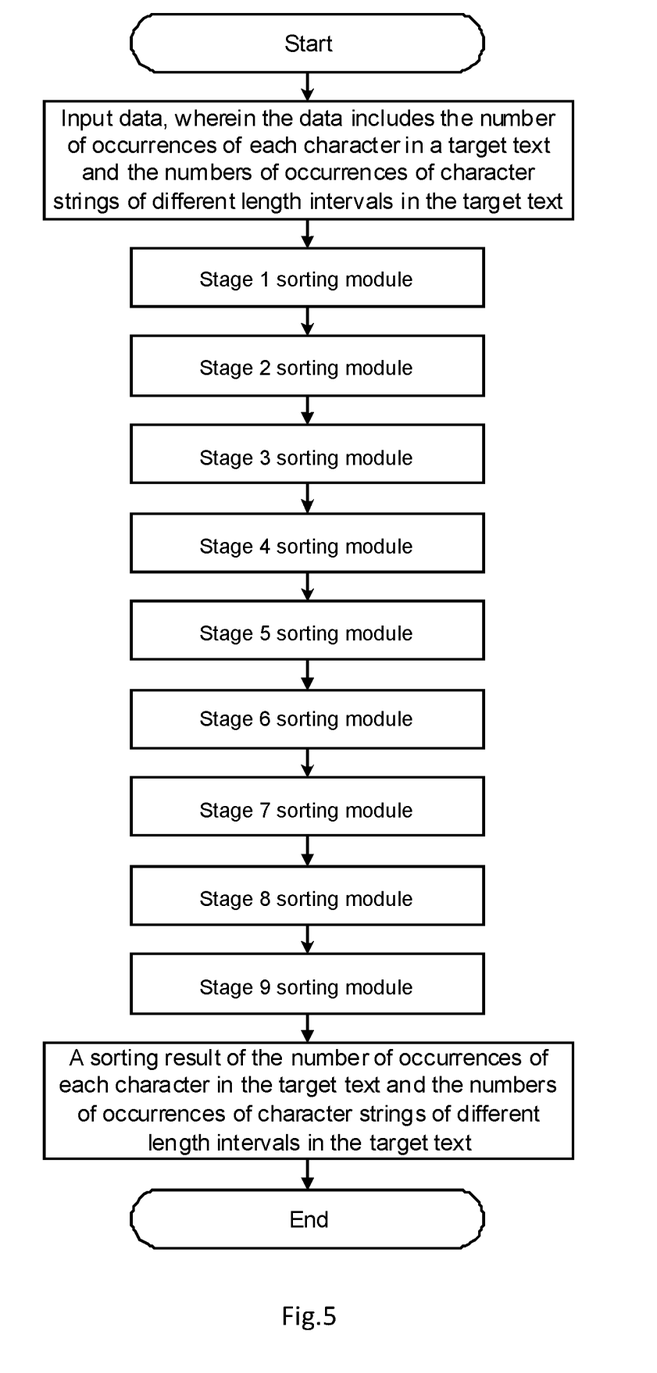
FIG. 5 is a flowchart of a sorting process in Embodiment 2 of the dynamic Huffman encoding method based on the sorting network provided in the present disclosure.

In summary, the sorting process is shown in FIG. 5. It can be seen that, by using the dynamic Huffman coding based on the sorting network, only a 9-stage sorting network needs to be introduced, and the sorting result may be efficiently and stably obtained through 45 beats.

Therefore, by means of the dynamic Huffman encoding method based on the sorting network provided in the present embodiment, the sorting solution based on the sorting network is high in efficiency, and a stable sorting result may be obtained; by means of skillfully constructing a data structure, the Literal elements and the Length elements in the dynamic Huffman coding may be sorted at the same time through a single sorting process, thereby being quick and convenient; and due to the sorting characteristic of parallel processing, all calculation and storage modes not only improve the efficiency for software calculation, but may also implement hardware, such that the application of the method is more flexible due to the various implementable forms.

A dynamic Huffman coding apparatus based on a sorting network provided in an embodiment of the present disclosure is introduced below, and the dynamic Huffman coding apparatus based on the sorting network described below and the dynamic Huffman encoding method based on the sorting network described above may correspond and refer to each other.

Figure 6:
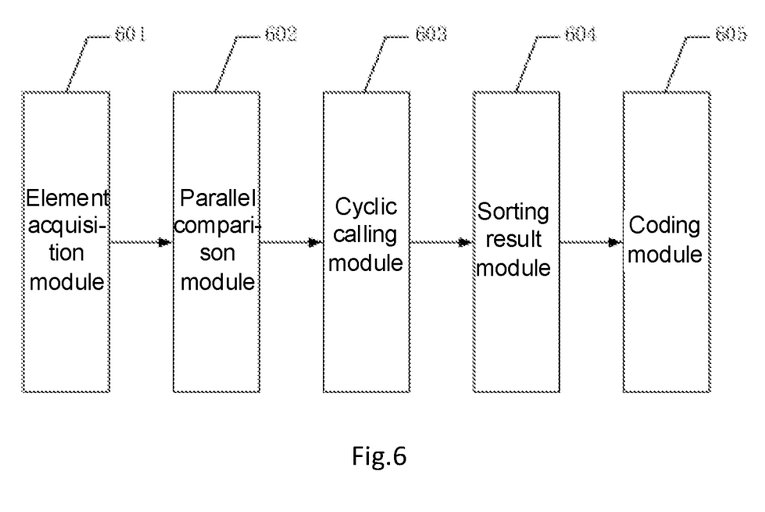
FIG. 6 is a functional block diagram of an embodiment of a dynamic Huffman coding apparatus based on a sorting network provided in the present disclosure.

The present embodiment provides a dynamic Huffman coding apparatus based on a sorting network, wherein the sorting network includes n stages of sorting modules, and n is a positive integer. As shown in FIG. 6, the apparatus includes:

an element acquisition module 601, configured to acquire elements to be sorted, and initialize i=1, wherein the elements to be sorted include Literal elements and Length elements, the Literal elements are used for describing the number of occurrences of each character in a target text, and the Length elements are used for describing the numbers of occurrences of character strings of different length intervals in the target text;

a parallel comparison module 602 configured to: in an ith-stage sorting module, generate, by using each of ith-stage sorting units and by means of i times of parallel comparison, a sorting result of $2^i$ elements to be sorted according to the sorting result of a previous-stage sorting module, so as to obtain the sorting result of the ith-stage sorting module, wherein the ith-stage sorting module includes $n/2^i$ parallel ith-stage sorting units;

a cyclic calling module 603 configured to: when i is less than n, increase i by 1 and enter the parallel comparison module;

a sorting result module 604 configured to: when i is equal to n, determine that the sorting result of the ith-stage sorting module is the sorting result of the elements to be sorted; and a encoding module 605, configured to construct a Huffman tree according to the sorting result of the elements to be sorted, and code the target text according to the Huffman tree.

The dynamic Huffman coding apparatus based on the sorting network in the present embodiment is used for implementing the forgoing dynamic Huffman encoding method based on the sorting network, therefore the specific implementation of the apparatus may refer to the foregoing embodiments of the dynamic Huffman encoding method based on the sorting network, for example, the element acquisition module 601, the parallel comparison module 602, the cyclic calling module 603, the sorting result module 604 and the encoding module 605 are respectively used for implementing the steps S101, S102, S103, S104 and S105 in the dynamic Huffman encoding method based on the sorting network as described above. Therefore, the specific implementation may refer to the description of the embodiments of various corresponding parts, and thus is not repeated herein.

In addition, since the dynamic Huffman coding apparatus based on the sorting network in the present embodiment is used for implementing the forgoing dynamic Huffman encoding method based on the sorting network as described above, the functions thereof correspond to the effects of the foregoing method, and thus are not repeated herein again.

In addition, the present disclosure further provides a dynamic Huffman coding device based on a sorting network, including:
- a memory, configured to store a computer program; and
- a processor, configured to execute the computer program, so as to implement the dynamic Huffman encoding method based on the sorting network as described above.

Finally, the present disclosure provides a readable storage medium, wherein a computer program is stored on the readable storage medium, and the computer program is used for, when executed by a processor, implementing the dynamic Huffman encoding method based on the sorting network as described above.

Various embodiments in the present specification are described in a progressive manner, each embodiment focuses on the difference from other embodiments, and the same or similar parts between the embodiments may refer to each other. For the apparatus disclosed in the embodiments, it is basically similar to the method disclosed in the embodiments, thus is described simply, and related parts may refer to the description in the method.

The steps of the method or algorithm described in combination with the embodiments disclosed herein may be implemented directly using hardware, a software module executed by a processor, or a combination of the two. The software module may be placed in a random access memory (RAM), an internal memory, a read-only memory (ROM), an electrically programmable ROM, an electrically erasable programmable ROM, a register, a hard disk, a removable disk, a CD-ROM, or any other form of storage medium known in the art.

The solutions provided in the present disclosure are described in detail above, and specific examples are used herein to describe the principles and implementations of the present disclosure, and the description of the above embodiments is merely used to help understand the method of the present disclosure and the core idea thereof; and at the same time, those ordinary skilled in the art may make changes to the specific implementations and application ranges according to the idea of the present disclosure. In summary, the content of the present specification should not be construed as a limitation to the present disclosure.

What is claimed is:

1. A dynamic Huffman encoding method based on a sorting network, wherein the sorting network comprises n stages of sorting modules, n is a positive integer, and the method comprises:
   S1, acquiring elements to be sorted, and initializing i=1, wherein the elements to be sorted comprise Literal elements and Length elements, the Literal elements are used for describing a number of occurrences of each character in a target text, and the Length elements are used for describing numbers of occurrences of character strings of different length intervals in the target text;
   S2, in an ith-stage sorting module, generating, by using each of ith-stage sorting units and by means of i times of parallel comparison, a sorting result of $2^i$ elements to be sorted according to the sorting result of a previous-stage sorting module, so as to obtain the sorting result of the ith-stage sorting module, wherein the ith-stage sorting module comprises $n/2^i$ parallel ith-stage sorting units;
   S3, judging whether i is less than n, when i is less than n, increasing i by 1 and entering S2; when i is equal to n, determining that the sorting result of the ith-stage sorting module is the sorting result of the elements to be sorted; and
   S4, constructing a Huffman tree according to the sorting result of the elements to be sorted, and encoding the target text according to the Huffman tree.

2. The method according to claim 1, wherein before acquiring the elements to be sorted, the method further comprises:
   determining the Literal elements and the Length elements according to the target text;
   generating padding elements when a number of the Literal elements and a number of the Length elements fall between $2^{n-1}$ and $2^n$, so that the total sum of the number of the Literal elements, the number of the Length elements and the number of the padding elements is $2^n$; and
   using the Literal elements, the Length elements and the padding elements as the elements to be sorted.

3. The method according to claim 2, wherein the Literal element and the Length element each comprises m bits, m1 bits represent the number of occurrences of a character or a character string, m2 bits represent that the current element is the Literal element or the Length element, m is a positive integer greater than 2, and m=m1+m2.

4. The method according to claim 3, wherein the padding element comprises m bits, and each bit being 1.

5. The method according to claim 4, wherein a value of m being 16.

6. The method according to claim 1, wherein in the ith-stage sorting module, generating, by using each of ith-stage sorting units and by means of I times of parallel comparison, the sorting result of $2^i$ elements to be sorted according to the sorting result of the previous-stage sorting module, comprises:
   when I is 1, in a first-stage sorting module, sorting, by the first first-stage sorting unit, the first two elements to be sorted, and a sorting process comprises: comparing the first element to be sorted with the second element to be sorted, so as to obtain the sorting result of the two elements to be sorted.

7. The method according to claim 6, wherein in the ith-stage sorting module, generating, by using each of ith-stage sorting units and by means of i times of parallel comparison, the sorting result of $2^i$ elements to be sorted according to the sorting result of the previous-stage sorting module, comprises:
   when i is 2, in a second-stage sorting module, sorting, by the first second-stage sorting unit, the sorting results of the first two first-stage sorting units in the first-stage sorting module, and the sorting process comprises: comparing the first element to be sorted with the fourth element to be sorted according to the current sorting result, and meanwhile, comparing the second element to be sorted with the third element to be sorted; adjusting the arrangement sequence of the elements to be sorted according to a comparison result; and comparing the first element to be sorted with the second element to be sorted, and meanwhile, comparing the third element to be sorted with the fourth element to be sorted, so as to obtain the sorting result of the four elements to be sorted.

8. A dynamic Huffman coding device based on a sorting network, wherein the sorting network comprises n stages of sorting modules, n is a positive integer, comprising:
   a memory, configured to store a computer program; and
   a processor, configured to execute the computer program, so as to:
   S1, acquire elements to be sorted, and initializing i=1, wherein the elements to be sorted comprise Literal elements and Length elements, the Literal elements are used for describing a number of occurrences of each character in a target text, and the Length elements are used for describing numbers of occurrences of character strings of different length intervals in the target text;
   S2, in an ith-stage sorting module, generate, by using each of ith-stage sorting units and by means of i times of parallel comparison, a sorting result of $2^i$ elements to be sorted according to the sorting result of a previous-stage sorting module, so as to obtain the sorting result of the ith-stage sorting module, wherein the ith-stage sorting module comprises $n/2^i$ parallel ith-stage sorting units;
   S3, judge whether i is less than n, when i is less than n, increase i by 1 and enter S2; when i is equal to n, determine that the sorting result of the ith-stage sorting module is the sorting result of the elements to be sorted; and
   S4, constructe a Huffman tree according to the sorting result of the elements to be sorted, and encode the target text according to the Huffman tree.

9. A computer-readable storage medium, wherein a computer program is stored on the computer-readable storage medium, and the computer program is configured to, when executed by a processor, cause the processor to:
   S1, acquire elements to be sorted, and initializing i=1, wherein the elements to be sorted comprise Literal elements and Length elements, the Literal elements are used for describing a number of occurrences of each character in a target text, and the Length elements are used for describing numbers of occurrences of character strings of different length intervals in the target text;
   S2, in an ith-stage sorting module, generate, by using each of ith-stage sorting units and by means of i times of parallel comparison, a sorting result of $2^i$ elements to be sorted according to the sorting result of a previous-stage sorting module, so as to obtain the sorting result of the ith-stage sorting module, wherein the ith-stage sorting module comprises $n/2^i$ parallel ith-stage sorting units;
   S3, judge whether i is less than n, when i is less than n, increase i by 1 and enter S2; when i is equal to n, determine that the sorting result of the ith-stage sorting module is the sorting result of the elements to be sorted; and
   S4, constructe a Huffman tree according to the sorting result of the elements to be sorted, and encode the target text according to the Huffman tree.

10. The computer-readable storage medium according to claim 9, the computer program is further configured to cause the processor to:
    before acquiring the elements to be sorted, determine the Literal elements and the Length elements according to the target text;
    generate padding elements when a number of the Literal elements and a number of the Length elements fall between $2^{n-1}$ and $2^n$, so that the total sum of the number of the Literal elements, the number of the Length elements and the number of the padding elements is $2^n$; and
    use the Literal elements, the Length elements and the padding elements as the elements to be sorted.

11. The computer-readable storage medium according to claim 10, wherein the Literal element and the Length element each comprises m bits, m1 bits represent the number of occurrences of a character or a character string, m2 bits represent that the current element is the Literal element or the Length element, m is a positive integer greater than 2, and m=m1+m2.

12. The computer-readable storage medium according to claim 11, herein the padding element comprises m bits, and each bit being 1.

13. The computer-readable storage medium according to claim 9, the computer program is further configured to cause the processor to:
    when i is 1, in a first-stage sorting module, sort, by the first first-stage sorting unit, the first two elements to be sorted, and a sorting process comprises: comparing the first element to be sorted with the second element to be sorted, so as to obtain the sorting result of the two elements to be sorted.

14. The computer-readable storage medium according to claim 9, the computer program is further configured to cause the processor to:
    when i is 2, in a second-stage sorting module, sort, by the first second-stage sorting unit, the sorting results of the first two first-stage sorting units in the first-stage sorting module, and the sorting process comprises: comparing the first element to be sorted with the fourth element to be sorted according to the current sorting result, and meanwhile, comparing the second element to be sorted with the third element to be sorted; adjusting the arrangement sequence of the elements to be sorted according to a comparison result; and comparing the first element to be sorted with the second element to be sorted, and meanwhile, comparing the third element to be sorted with the fourth element to be sorted, so as to obtain the sorting result of the four elements to be sorted.

15. The dynamic Huffman coding device according to claim 8, the processor is configured to execute the computer program to:
    before acquiring the elements to be sorted, determine the Literal elements and the Length elements according to the target text;
    generate padding elements when a number of the Literal elements and a number of the Length elements fall between $2^{n-1}$ and $2^n$, so that the total sum of the number of the Literal elements, the number of the Length elements and the number of the padding elements is $2^n$; and
    use the Literal elements, the Length elements and the padding elements as the elements to be sorted.

16. The dynamic Huffman coding device according to claim 15, wherein the Literal element and the Length element each comprises m bits, m1 bits represent the number of occurrences of a character or a character string, m2 bits represent that the current element is the Literal element or the Length element, m is a positive integer greater than 2, and m=m1+m2.

17. The dynamic Huffman coding device according to claim 16, wherein the padding element comprises m bits, and each bit being 1.

18. The dynamic Huffman coding device according to claim 17, wherein a value of m being 16.

19. The dynamic Huffman coding device according to claim 8, the processor is configured to execute the computer program to:
when i is 1, in a first-stage sorting module, sort, by the first first-stage sorting unit, the first two elements to be sorted, and a sorting process comprises: comparing the first element to be sorted with the second element to be sorted, so as to obtain the sorting result of the two elements to be sorted.

20. The dynamic Huffman coding device according to claim 8, the processor is configured to execute the computer program to:
when i is 2, in a second-stage sorting module, sort, by the first second-stage sorting unit, the sorting results of the first two first-stage sorting units in the first-stage sorting module, and the sorting process comprises: comparing the first element to be sorted with the fourth element to be sorted according to the current sorting result, and meanwhile, comparing the second element to be sorted with the third element to be sorted; adjusting the arrangement sequence of the elements to be sorted according to a comparison result; and comparing the first element to be sorted with the second element to be sorted, and meanwhile, comparing the third element to be sorted with the fourth element to be sorted, so as to obtain the sorting result of the four elements to be sorted.

\* \* \* \* \*